United States Patent [19]

Anderson et al.

[11] Patent Number: 5,371,043

[45] Date of Patent: Dec. 6, 1994

[54] METHOD FOR FORMING A POWER CIRCUIT PACKAGE

[75] Inventors: Samuel J. Anderson, Tempe; Guillermo L. Romero, Phoenix, both of Ariz.

[73] Assignee: Motorola, Inc., Schaumburg, Ill.

[21] Appl. No.: 255,533

[22] Filed: May 25, 1994

Related U.S. Application Data

[63] Continuation of Ser. No. 972,347, Nov. 6, 1992, abandoned.

[51] Int. Cl.⁵ .............................................. H01L 21/60
[52] U.S. Cl. ..................... 437/209; 437/211; 437/213; 437/214; 437/219
[58] Field of Search ............ 437/209, 211, 210, 214, 437/219, 213, 220; 164/91, 98

[56] References Cited

U.S. PATENT DOCUMENTS

| | | | |
|---|---|---|---|
| 4,451,973 | 6/1984 | Tateno et al. | 437/214 |
| 4,783,428 | 11/1988 | Kalfus | 437/209 |
| 4,791,075 | 12/1988 | Lin | 437/209 |
| 4,859,640 | 8/1989 | Newkirk. | |
| 4,957,876 | 9/1990 | Shibata | 437/209 |
| 4,960,736 | 10/1990 | Luxzcz et al. | |
| 4,996,170 | 2/1991 | Baird. | |
| 5,007,475 | 4/1991 | Kennedy et al. | |
| 5,091,341 | 2/1992 | Asada et al. | 437/214 |
| 5,098,864 | 3/1992 | Mahulikar | 437/209 |
| 5,149,662 | 9/1992 | Eichelberger | 437/209 |
| 5,259,436 | 11/1993 | Yun et al. | |

OTHER PUBLICATIONS

Werdecker et al., "Aluminum Nitride-An Alternative Ceramic Substrate for High Power Applications in Microcircuits," IEEE Transactions on Components, Hybrids, and Manufacturing Technology, vol. CHMT-7, No. 4, Dec. 1984, pp. 399-404.

Primary Examiner—Brian E. Hearn
Assistant Examiner—Kevin M. Picardat
Attorney, Agent, or Firm—Joe E. Barbee; Rennie William Dover

[57] ABSTRACT

A method for forming a power circuit package (45) having a porous base structure (20) electrically isolated from a first porous die mount (21) and a second porous die mount (22) by a dielectric material (29). The porous base structure (20) is bonded to a second surface of the the dielectric material (29) whereas the first porous die mount (21), and the second porous die mount (22) are bonded to a first surface of the dielectric material (29). Simultaneous with the bonding step, the porous base structure (20), the first porous die mount (21), and the second porous die mount (22) are impregnated with a conductive material. Semiconductor die (32, 33, 34, and 35) are bonded to the impregnated die mounts. The semiconductor die (32, 33, 34, and 35) are then encapsulated by a molding compound.

16 Claims, 4 Drawing Sheets

METHOD FOR FORMING A POWER CIRCUIT PACKAGE

This application is a continuation of prior application Ser. No. 07/972,347, filed Nov. 6, 1992 now abandoned.

BACKGROUND OF THE INVENTION

This invention relates, in general, to methods of forming circuit packages, and more particularly, to a method for forming a semiconductor power circuit package.

Semiconductor devices are encapsulated within packages for protection from damage by external stresses and to provide a means for carrying electrical signals to and from the devices. Included in the repertoire of semiconductor device package types are dual-in-line packages, pin grid array packages, TAB packages, and multichip modules. More particularly, power semiconductor device packages may be formed as modules having a high thermal conductivity which are capable of dissipating large amounts of heat.

One type of power semiconductor device module includes a copper baseplate to which an isolation pad is mounted. The isolation pad may include a ceramic layer sandwiched between two thin copper sheets. One of the thin copper sheets is bonded to the copper baseplate wherein the copper baseplate serves as a heat sink. Semiconductor die are mounted to the second thin copper sheet and a leadframe is attached to the semiconductor die. Subsequently, the semiconductor die and a portion of the leadframe are encapsulated by a molding compound.

Although methods for manufacturing modules for power semiconductor devices have been taught in the prior art, these modules are not optimized for heat dissipation. In particular, the isolation pad and the copper baseplate have significantly different coefficients of thermal expansion. Thus, under conditions of high heat dissipation the copper baseplate may expand at a faster rate than the isolation pad thereby warping the isolation pad and potentially decreasing the reliability of the module. In addition, delamination of the thin copper sheets from the ceramic layer may result from mismatches between the coefficients of thermal expansion of the thin copper sheets and the ceramic layer.

Further, long power leads are typically soldered to the semiconductor device die. The die are not only stressed by the step of soldering the leads to the die but they are mechanically stressed by external forces which may be applied to the leads. In addition, the use of the long power leads inherently introduces both a parasitic inductance and a parasitic resistance, particularly at high operating frequencies. Other disadvantages include a requirement for a large number of piece parts and extra processing steps to form the parts into a package thereby increasing the cost of the package.

Accordingly, it would be advantageous to have a semiconductor device package that is a unitary package comprising components having similar coefficients of thermal expansion. Additionally, it is desirable that the inherent parasitic components such as parasitic inductances and resistances be minimized in the unitary package. Moreover, decreasing the number of piece parts in packages would lower the manufacturing cost as well as the cost for components. Finally, it would be advantageous to have a packaging method in which fragile semiconductor die, such as gallium arsenide die, may be reliably and inexpensively packaged.

SUMMARY OF THE INVENTION

Briefly stated, the present invention is a method for forming a semiconductor power circuit package. A porous base structure is provided having first and second major surfaces. A dielectric material is placed on the first major surface of the porous base structure. At least one porous mount is placed on the dielectric material. The porous base structure and the at least one porous mount are impregnated with a conductive material. The step of impregnation serves to bond the porous base structure and the at least one porous mount to the dielectric material.

DETAILED DESCRIPTION OF THE DRAWINGS

Figure 1:
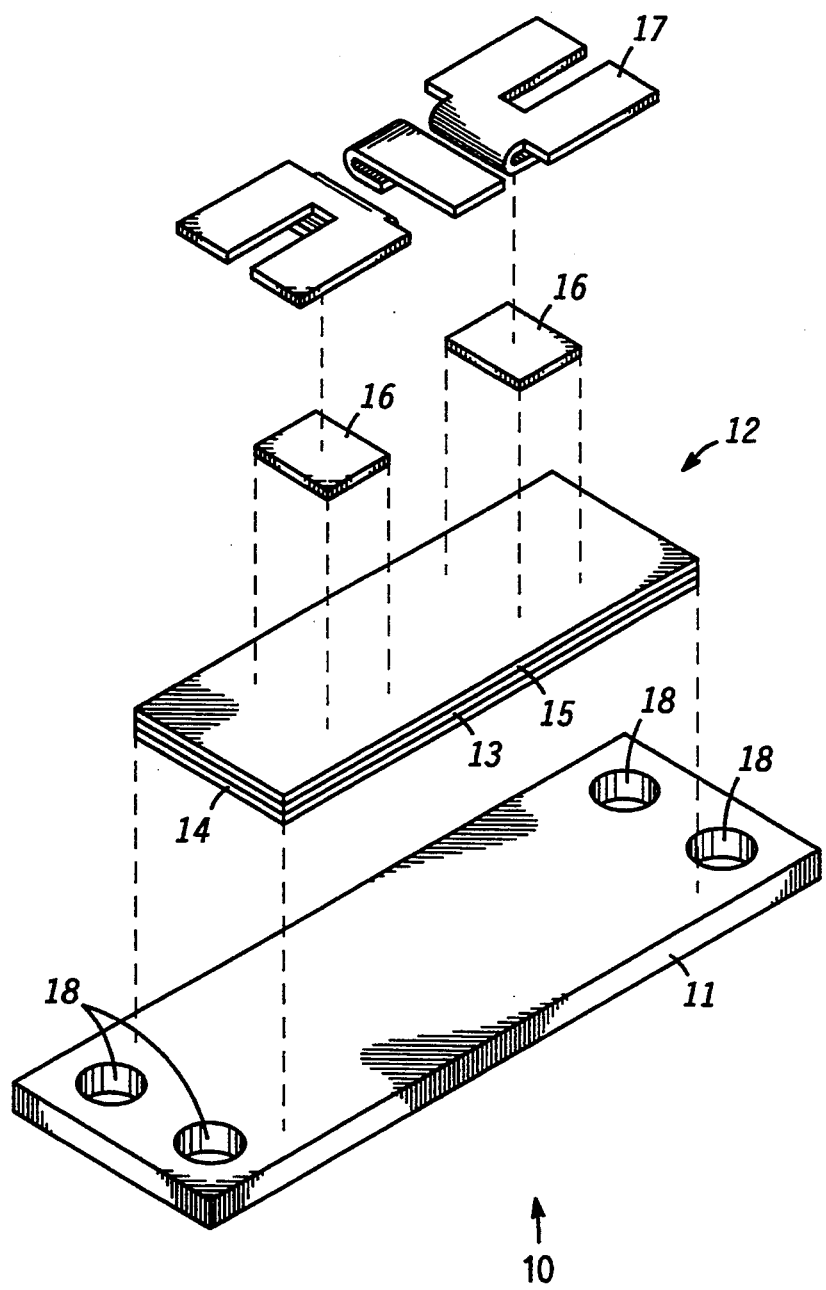
FIG. 1 illustrates an exploded isometric view of a prior art power circuit package.

FIG. 1 illustrates an exploded isometric view of a prior art power circuit package 10. Circuit package 10 has a baseplate 11 to which an isolation pad 12 is bonded. Baseplate 11 is copper which provides structural support for circuit package 10 and serves as a heat sink. Baseplate 11 may include mounting holes 18 to allow mounting or securing circuit package 10 to a cold-plate.

Isolation pad 12 typically comprises a tri-layer structure having a ceramic layer 13 sandwiched between a first and a second thin layer of copper 14 and 15, respectively. First thin layer of copper 14 is bonded to baseplate 11. Bonding layer of copper 14 to baseplate 11 may be achieved by soldering or other techniques well known in the art. In one embodiment, circuit package 10 is used in the formation of a rectifier circuit, thus rectifier die 16 are mounted to second thin layer of copper 15. Second thin layer of copper 15 may include an etched pattern for routing electrical signals. A leadframe 17 is mounted to rectifier die 16 followed by encapsulation (not shown) of die 16 and portions of leadframe 17. Methods for mounting and encapsulating rectifier die 16 are well known to those skilled in the art.

Figure 2:
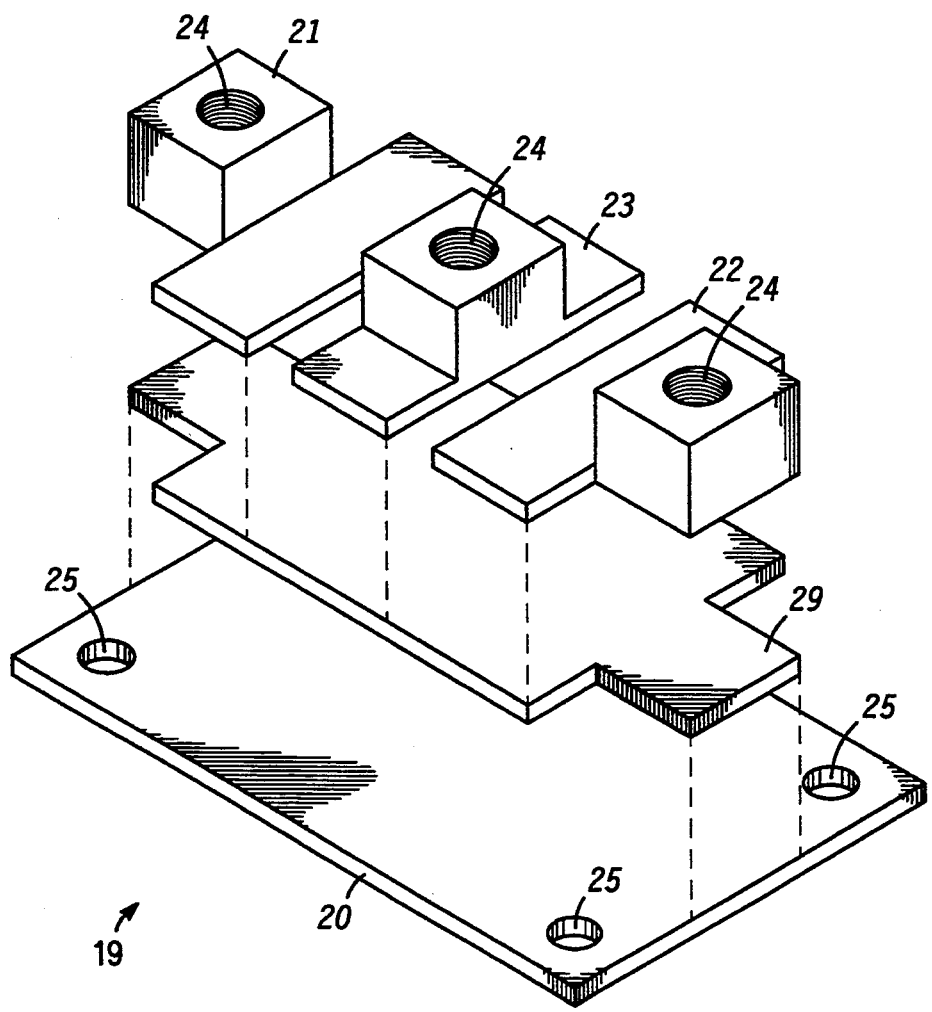
FIG. 2 illustrates an exploded isometric view of a power circuit package during fabrication, in accordance with the present invention.

FIG. 2 illustrates an exploded isometric view of a semiconductor circuit package 19 during fabrication, in accordance with the present invention. Preferably porous preform structures are formed from a slurry and molded into desired shapes. The slurry may comprise a mixture of a powdered semiconductor material such as silicon carbide and a binding agent such as a polymer based xylene. Alternatively, the porous preform structures may be machined into the desired shapes. Subsequently, the binding agent is burned out of the desired structures in a binder burn-out step thereby leaving a porous preform structure of silicon carbide. The porous preform structures are commonly referred to as green phase pieces. Preform structures and porous preforms may be manufactured using injection molding and die casting technologies such as Alcoa's process for fabricating highly loaded metal matrix composites.

In a rectifier circuit embodiment, the porous preform structures include a porous base structure 20 which may be planar, a first porous die mount 21, a second porous die mount 22, and a porous interconnect mount 23. Porous base structure 20 includes mounting holes 25 to permit mounting the semiconductor circuit package to a cold-plate. Each porous die mount 21, 22, and 23, also referred to as porous mounts 21, 22, and 23 or simply mounts 21, 22, and 23, has a threaded recess 24 for screw thread mounting. Preferably, the mold for forming recesses 24 includes screw threads such that recesses 24 are threaded recesses. Since the screw threads formed in the silicon carbide have the mechanical strength of the silicon carbide, mounts 21, 22, and 23 may be connected to connectors such as power connectors. Further mounts 21, 22, and 23 may include cavities or depressions 44 (see FIG. 6) for accepting semiconductor die, conductors, electrodes, or the like. The shapes of the preform structures are not a limitation of the present invention and may correspond to those shapes desired for a particular application.

FIG. 2 further illustrates the positional relationships of base structure 20, die mounts 21 and 22, interconnect mount 23, and a layer of dielectric material 29. Layer of dielectric material 29 is sandwiched between base structure 20 and mounts 21, 22, and 23 thereby electrically isolating base structure 20 from mounts 21, 22, and 23. Layer of dielectric material 29 may comprise an electrically insulating material such as a ceramic material. Preferably layer of dielectric material 29 is a thermally conductive material such as, for example, aluminum nitride. Alternatively, layer of dielectric material 29 may be aluminum oxide.

Figure 3:
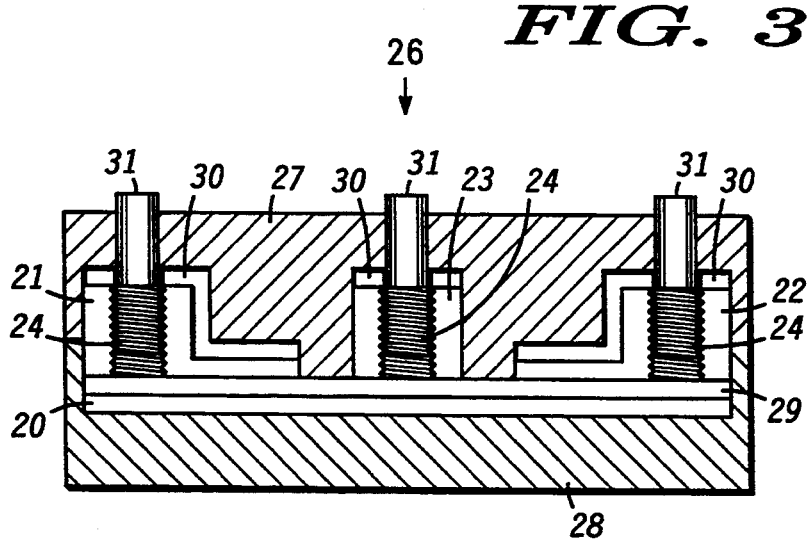
FIG. 3 illustrates a cross-sectional view of a mold assembly, in accordance with the present invention.

FIG. 3 illustrates a cross-sectional view of a mold assembly 26 having a top portion 27 and a bottom portion 28. Top portion 27 cooperates with bottom portion 28 to form a mold cavity. A second major surface of base structure 20 is placed in contact with bottom portion 28. A second major surface of layer of dielectric material 29 is placed on a first major surface of base structure 20. First die mount 21, second die mount 22, and interconnect mount 23 are placed on a first major surface of layer of dielectric material 29. In the rectifier circuit embodiment, first die mount 21 is placed at one end of layer of dielectric material 29, second die mount 22 is placed at the opposite end of layer of dielectric material 29, and interconnect mount 23 is positioned therebetween. Interconnect mount 23 is spaced apart from first and second die mounts 21 and 22, respectively. In addition to conducting heat from mounts 21, 22, and 23 to base structure 20, layer of dielectric material 29 electrically isolates mounts 21, 22, and 23 from base structure 20. Thus, layer of dielectric material 29 is an electrically insulating material. Top portion 27 is secured to bottom portion 28 thereby forming the mold cavity. Further, plugs 31 which may be, for example, a hex screw or a set screw are inserted through top portion 27 into recesses 24 to prevent aluminum penetration into recesses 24. In the rectifier circuit embodiment, the mold cavity formed by top and bottom portions 27 and 28, respectively, provides spaces 30 over mounts 21, 22, and 23.

A conductive material is injected, via runners (not shown), into the mold cavity. In one embodiment, the conductive material is molten aluminum which is injected at a pressure ranging between approximately 42 and 49 kilograms per square centimeter (between approximately 600 and 700 pounds per square inch in the English system of units). The molten aluminum impregnates the porous preform structures 20, 21, 22, and 23 through continuous capillary liquid flow. Further, the molten aluminum fills spaces 30 thereby creating conductive current paths (e.g. conductors 36 of FIG. 4). Although layer of dielectric material 29 remains impervious to the molten aluminum, injection of aluminum at pressures ranging between approximately 42 and 49 kilograms per square centimeter bonds the impregnated structures to the layer of dielectric material 29. Thus, the impregnated porous preform structures 20, 21, 22, and 23 are bonded to layer of dielectric material 29. Another suitable conductive material is copper, wherein the coefficient of thermal expansion of copper is closer to that of silicon carbide. In particular, the coefficient of thermal expansion of aluminum is approximately 22 parts per million (ppm) per degree celsius (°C.), and the coefficient of thermal expansion of silicon carbide is approximately 6.4 ppm per °C., whereas the coefficient of thermal expansion of copper is approximately 17 ppm per °C. Further, the malleability of copper is beneficial in that the copper adds to the structural support of the impregnated structure. Other suitable conductive materials include alloys of aluminum and copper.

Figure 4:
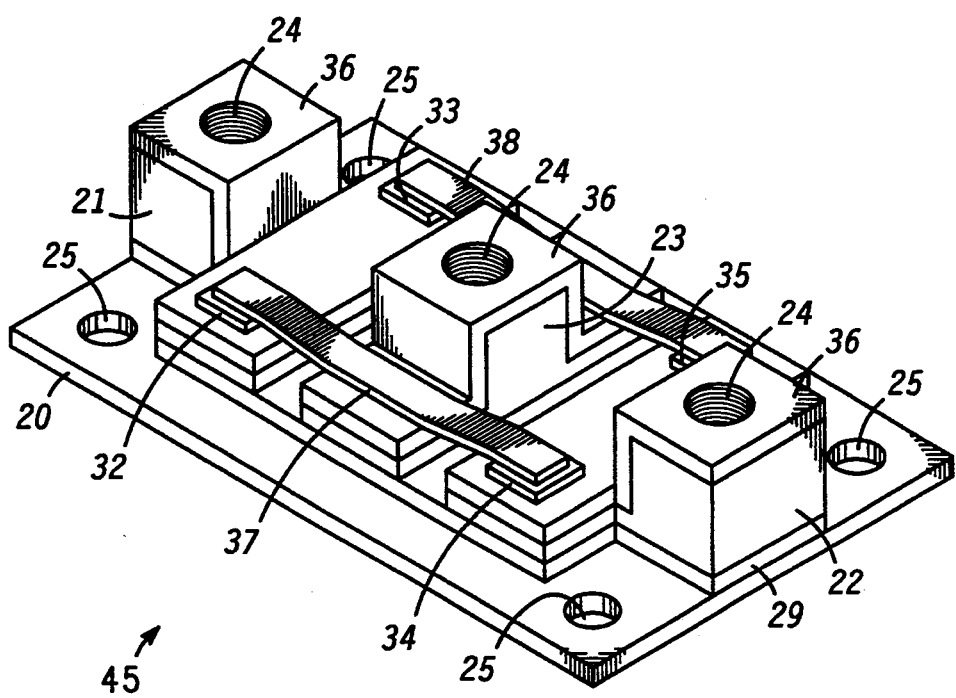
FIG. 4 illustrates an isometric view of the power circuit package of FIG. 2 during subsequent processing.

FIG. 4 illustrates an isometric view of a circuit package 45 after impregnation with the conductive material. The conductive material bonds base structure 20, mounts 21, 22, and 23, and layer of dielectric material 29 into a unitary structure. Further, the conductive material that filled spaces 30 of FIG. 3 remains over mounts 21, 22, and 23 and forms electrodes 36 on mounts 21, 22, and 23. In the example of an aluminum conductive material, the aluminum is preferably coated with nickel.

Alternatively, recesses 24 may be threaded by forming mold portion 27 such that recesses 24 become filled with aluminum. Recesses 24 may then be threaded by machining methods well known to one of skill in the art.

In the rectifier circuit embodiment, a pair of rectifier die 32 and 33 are attached to conductor 36 of first die mount 21 and a pair of rectifier die 34 and 35 are attached to conductor 36 of second die mount 22. Rectifier die 32 and 33 are spaced apart from each other and from threaded recess 24 on first die mount 21. Rectifier die 34 and 35 are spaced apart from each other and from threaded recess 24 on second die mount 22. It shall be understood that the number of die and the positioning of the die on die mounts 21 and 22 are not limitations of the present invention. Further, the type of semiconductor die is not a limitation of the present invention. In other words, the semiconductor die may be silicon or a compound semiconductor such as gallium arsenide, silicon carbide, silicon germanium or other well known semiconductor or compound semiconductor materials used in the formation of transistors or semiconductor devices. Methods for attaching semiconductor die to a nickel coated conductive material, such as aluminum, are well known to those skilled in the art.

One end of a first conductive clip 37 is bonded to rectifier die 32 and a second end of first conductive clip 37 is bonded to rectifier die 34. A central portion of conductive clip 37 is bonded to interconnect mount 23. One end of a second conductive clip 38 is bonded to rectifier die 33 and a second end of second conductive clip 38 is bonded to rectifier die 35. A central portion of conductive clip 38 is bonded to interconnect mount 23. Preferably, conductive clips 37 and 38 are copper and are soldered to interconnect mount 23 and the respective die. Many techniques are known for bonding conductive clips 37 and 38 to die 32, 33, 34, and 35 and to nickel coated aluminum electrodes formed on interconnect mount 23.

Figure 5:
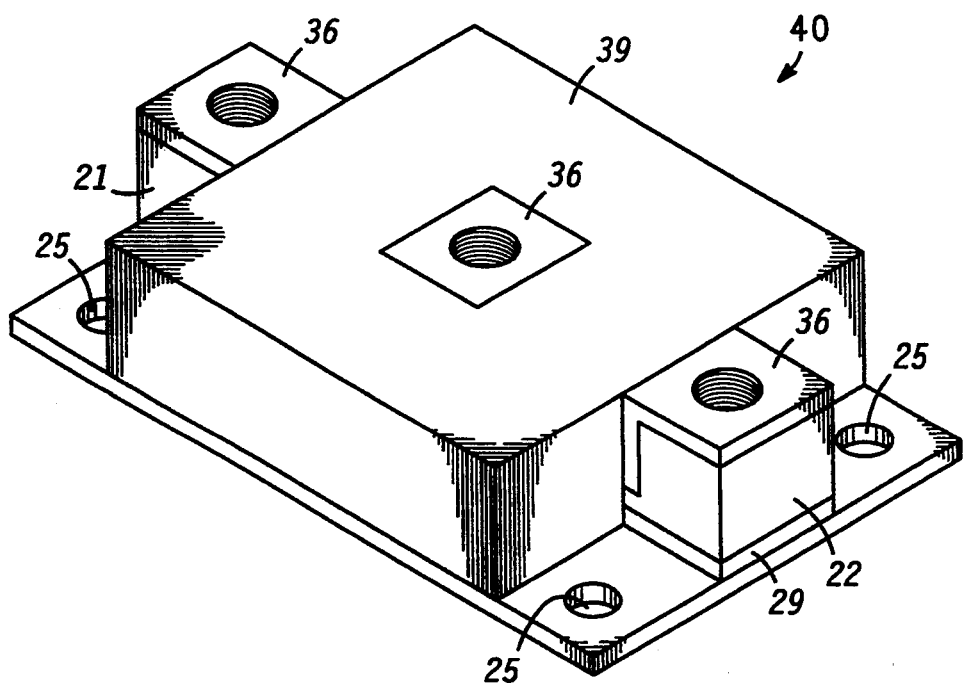
FIG. 5 illustrates an isometric view of an encapsulated power circuit package.

FIG. 5 illustrates an encapsulated circuit package 40. Preferably the encapsulating material 39 is formed from a low stress liquid polyester mold compound. An encapsulation method suitable for use in the present invention is described in U.S. Pat. No. 4,996,170, entitled "Molding Process For Encapsulating Semiconductor Devices Using A Thixotropic Compound", by John Baird, issued Feb. 26, 1991 and assigned to the same assignee as the present application. U.S. Pat. No. 4,996,170 is incorporated herein by reference. The encapsulating material provides protection for the integrated circuit die from external stresses. Further, external conductors are attached to portions of conductors 36 adjacent to threaded recesses 24 rather than the prior art approach of bonding external conductors directly to semiconductor die 32, 33, 34, and 35. Thus, the present invention eliminates the mechanical stress on the semiconductor die which occurred in the prior art when the external conductors bonded directly to the die were stressed.

Figure 6:
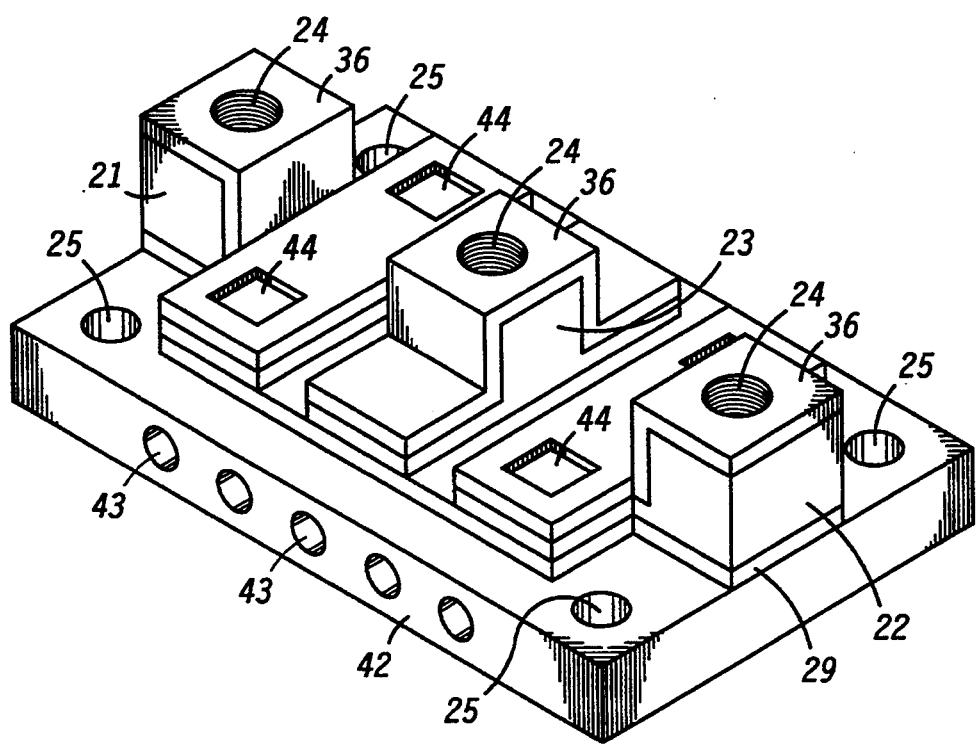
FIG. 6 illustrates an isometric view of an non-encapsulated power circuit package capable of supporting fluid flow in accordance with the present invention.

FIG. 6 illustrates a fluid cooled embodiment of the present invention. In the fluid cooled embodiment, a porous base structure 42 is formed having ducts 43 capable of supporting cooling fluid flow. Ducts 43 serve as conduits through which a cooling fluid flows. The fluid transports heat away from base structure 42. The processing steps for forming the structure of the fluid cooled embodiment are analogous to those for forming the structure without the ducts. The only difference between the fluid cooled embodiment and circuit package 45 of FIG. 4 is that the base structure (reference numeral 42 in FIG. 6) includes ducts 43.

By now it should be appreciated that there has been provided a method for forming a power circuit package. The power circuit package may be used as a package for hybrid power circuits. The power circuit package includes a substrate mount, die mounts, an interconnect mount and an electrical isolation layer integrated into a unitary structure or a unitary circuit module. One method includes forming the mounts from a silicon carbide preform and the electrical isolation layer from aluminum nitride. Subsequently, the silicon carbide is impregnated with aluminum wherein the step of impregnation simultaneously bonds the electrical isolation layer to the silicon carbide. Impregnation with aluminum further serves to reinforce and strengthen the silicon carbide. The coefficients of thermal expansion of the aluminum nitride electrical isolation layer and the aluminum impregnated silicon carbide mounts are similar. Thus, the present invention mitigates the warpage and subsequent delamination phenomena which tend to occur in the prior art methods. In addition, the method of the present invention permits packaging of high power semiconductor integrated circuits fabricated in fragile semiconductor substrates such as gallium arsenide.

Further, the mounts are coated with a conductive material thereby providing a package structure having large areas which can serve as conductors. Conductors having large areas introduce low inductive and resistive parasitic components. Thus, the formation of conductors on the mounts not only integrates the conductors into a single package but reduces parasitic components which degrade circuit performance.

The formation of a unitary structure translates into a reduction in the number of piece parts required for package construction. In addition, the number of assembly steps for forming the package is decreased. Thus, the semiconductor circuit package of the present invention is less expensive to manufacture because cost for components is lower and it is less expensive to assemble the components into a package.

We claim:

1. A method for forming a power circuit package, comprising the steps of:
   providing a porous planar base structure having first and second major surfaces;
   placing a second major surface of a dielectric material on the first major surface of the porous planar base structure;
   placing at least one porous mount on a first major surface of the dielectric material; and
   impregnating the porous planar base structure and the porous mount with a conductive material, wherein the step of impregnating bonds the porous planar base structure and the porous mount to the dielectric material.

2. A method for forming a power circuit package as claimed in claim 1 wherein the step of placing the second major surface of a dielectric material on the first major surface of the porous planar base structure includes placing the dielectric material comprising a ceramic material.

3. A method for forming a power circuit package as claimed in claim 1 wherein the step of placing at least one porous mount includes placing a first die mount, a second die mount, and an interconnect mount on the first major surface of the dielectric material, wherein the interconnect mount is between and spaced apart from the first and the second die mounts.

4. A method for forming a power circuit package as claimed in claim 1 wherein the step of impregnating includes impregnating with aluminum.

5. A method for forming a power circuit package as claimed in claim 1 further including providing a porous planar base structure having at least one duct wherein the duct serves as a conduit through which a cooling fluid flows.

6. A method for forming a power circuit package as claimed in claim 1 further including providing the porous planar base structure and the at least one porous mount from the same material.

7. A method for packaging a semiconductor device, comprising the steps of:
   molding a base structure;
   molding at least one mount;
   placing an electrically insulating material on the base structure;
   placing the at least one mount on the electrically insulating material;
   impregnating the base structure and the at least one mount with a conductive material thereby forming an impregnated structure having the base structure and the at least one mount bonded to the electrically insulating material and an electrode on the at least one mount;
   mounting at least one semiconductor device on the impregnated structure;

providing an electrical interconnect to the at least one semiconductor device; and encapsulating the impregnated structure.

8. A method for packaging a semiconductor device as claimed in claim 7 wherein the step of molding the base structure and the at least one mount includes molding the base structure and the at least one mount from a slurry comprising silicon carbide and a binding agent.

9. A method for packaging a semiconductor device as claimed in claim 7 wherein the step of mounting the at least one semiconductor device includes soldering the semiconductor device.

10. A method for packaging a semiconductor device as claimed in claim 7 wherein the step of impregnating the base structure and the at least one mount includes impregnating the base structure and the at least one mount with aluminum.

11. A method for packaging a semiconductor device as claimed in claim 7, further including providing a ceramic as the electrically insulating material.

12. A method for forming a unitary circuit module, comprising the steps of:

providing a mold assembly having a first portion and a second portion wherein the first portion and the second portion cooperate to form a mold cavity;

placing a molded porous base structure in the first portion of the mold assembly;

placing a layer of dielectric material on the molded porous base structure;

placing at least one molded porous mount on the layer of dielectric material;

injecting a conductive material into the mold cavity, wherein the step of injecting the conductive material forms the unitary circuit module; and removing the unitary circuit module from the mold cavity.

13. A method for forming a circuit module as claimed in claim 12 wherein the molded porous base structure and the at least one molded porous mount are formed including silicon carbide.

14. A method for forming a circuit module as claimed in claim 12 wherein the step of placing a layer of dielectric material includes placing a layer of dielectric material comprising aluminum nitride.

15. A method for forming a circuit module as claimed in claim 12 wherein the step of injecting a conductive material includes injecting a conductive material comprising aluminum.

16. A method for forming a circuit module as claimed in claim 12 wherein the step of placing a molded porous base structure includes placing a molded porous base structure having at least one duct through which a fluid can flow.

* * * * *